US009077190B2

(12) United States Patent
Posat

(10) Patent No.: US 9,077,190 B2
(45) Date of Patent: Jul. 7, 2015

(54) POWER SWITCH WITH REVERSE CURRENT BLOCKING CAPABILITY

(71) Applicant: Decicon, Inc., Santa Clara, CA (US)

(72) Inventor: Baris Posat, San Jose, CA (US)

(73) Assignee: Decicon, Inc., Santa Clara, CA (US)

( * ) Notice: Subject to any disclaimer, the term of this patent is extended or adjusted under 35 U.S.C. 154(b) by 43 days.

(21) Appl. No.: 13/939,982

(22) Filed: Jul. 11, 2013

(65) Prior Publication Data

US 2013/0301175 A1 Nov. 14, 2013

Related U.S. Application Data

(63) Continuation of application No. 12/828,230, filed on Jun. 30, 2010, now Pat. No. 8,508,078.

(60) Provisional application No. 61/221,957, filed on Jun. 30, 2009.

(51) Int. Cl.
| | |
|---|---|
| *H01H 35/00* | (2006.01) |
| *H02J 7/00* | (2006.01) |
| *H03K 17/082* | (2006.01) |
| *H03K 17/30* | (2006.01) |
| *H02H 3/18* | (2006.01) |
| *H03K 17/06* | (2006.01) |

(52) U.S. Cl.
CPC ............ *H02J 7/0034* (2013.01); *H02J 7/0036* (2013.01); *H03K 17/0822* (2013.01); *H03K 17/302* (2013.01); *H03K 2017/066* (2013.01); *H03K 2017/307* (2013.01); *H02H 3/18* (2013.01)

(58) Field of Classification Search
CPC ............ H03K 17/0822; H03K 17/302; H03K 2017/307; H02H 3/18; H02J 7/0034; H02J 7/0036
USPC ................................ 307/127, 138; 361/82, 84
See application file for complete search history.

(56) References Cited

U.S. PATENT DOCUMENTS 8,508,078 B2 * 8/2013 Posat ............................ 307/127

\* cited by examiner

*Primary Examiner* — Carlos Amaya
(74) *Attorney, Agent, or Firm* — Kilpatrick Townsend and Stockton LLP

(57) ABSTRACT

A switching circuit controls the flow of current between its input and output in accordance with the state of a control signal applied to the circuit. When the control signal is in a first state and the voltage applied to the input is higher than the voltage at the output, the circuit provides a low resistance path between its input and output terminals thereby enabling current to flow from the input to the output. When the control signal is in the first state and the voltage at the output is higher than the voltage at the input, the circuit inhibits current flow from the output to the input. When the control signal is in a second state, the circuit is turned off thus inhibiting current flow between the input and the output.

4 Claims, 10 Drawing Sheets

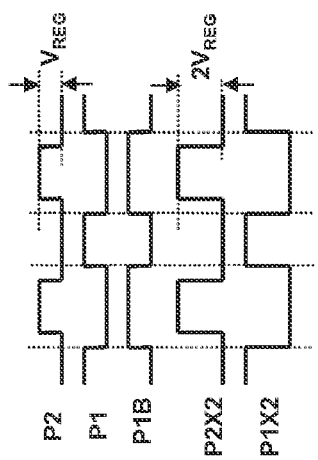
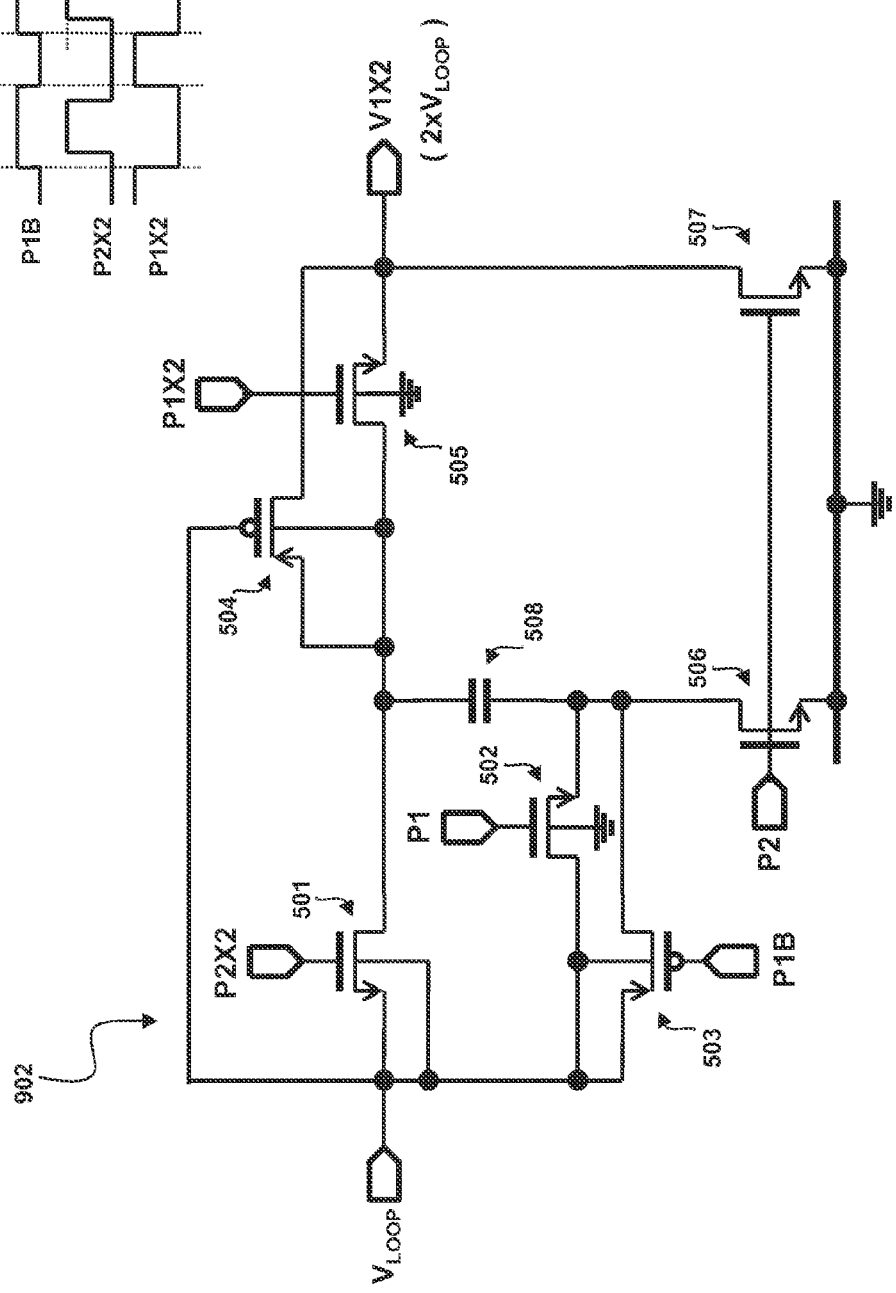
Figure 6B
Figure 6A

POWER SWITCH WITH REVERSE CURRENT BLOCKING CAPABILITY

CROSS-REFERENCE TO RELATED APPLICATIONS

The present application is a continuation of U.S. patent application Ser. No. 12/828,230, filed Jun. 30, 2010, entitled "POWER SWITCH WITH REVERSE CURRENT BLOCKING CAPABILITY", which claims benefit under 35 USC 119(e) of U.S. Provisional Application No. 61/221,957, filed Jun. 30, 2009, which are incorporated herein by reference in their entirety for all purposes.

BACKGROUND OF THE INVENTION

The present invention relates to electronic circuits, and more particularly to integrated circuits used to deliver power to various sections of an electronic system.

Power switches are frequently used in electronic systems to control power delivery to various sections of the system and to disconnect loads from power sources when the load is not in use. They also often provide protection to the load and to the power source. Two of the common protection features are current limiting and Reverse Current Blocking (RCB). Current limiting guarantees that the load current is limited at a maximum level by the power switch. Reverse current blocking guarantees that the power switch can conduct current only in one direction, similar to a diode. A need continues to exist for improved reverse current blocking capability of power switches.

BRIEF SUMMARY OF THE INVENTION

A reverse current blocking (RCB) circuit, in accordance with one embodiment of the present invention includes, in part, a first transistor having a first current carrying terminal coupled to a first input terminal of the RCB circuit and a second current carrying terminal coupled to a first node, a first charge pump operative to supply a first voltage signal to a gate terminal of the first transistor in response to a reference voltage, a second transistor having a first current carrying terminal coupled to an output terminal of the RCB circuit and a second current carrying terminal coupled to the first node, a second charge pump operative to supply a second voltage signal to a gate terminal of the second transistor, and an amplifier having a first input terminal receiving the output voltage of the RCB circuit and a second input terminal receiving a voltage defined by a voltage of the first node and an offset voltage. The amplifier supplies a feedback voltage to the second charge pump. In some embodiments, the offset voltage is the internal offset voltage of one or blocks of the RCB circuit. In one embodiment, the first and second transistors are N-channel MOS (NMOS) transistors.

In some embodiments, the RCB circuit further includes, in part, a current sensing circuit and a current sink circuit. The current sensing circuit senses the current flowing through the first input terminal of the RCB circuit. The current sink circuit sinks the current from the gate terminal of the first transistor when the sensed current is detected as exceeding a predefined value. In one embodiment, the current sink is a non-linear current sink. In one embodiment, the current sink is an exponential current sink.

In some embodiments, the RCB circuit includes, in part, a number of multiplier circuits. A first multiplier receives the first and second non-overlapping pulse signals, and in response, generates third and fourth non-overlapping signals. The first and second non-overlapping pulse signals may vary in voltage level between the first and second supply voltages. The third and fourth non-overlapping signals may vary in voltage level between the first supply voltage and a multiple of the second supply voltage. A second and third multiplier circuits generate voltages that are multiples of the feedback voltage. A voltage coupling circuit generates the second voltage in response to the second and third multiplication circuits. In one embodiment, the multiple is two.

In accordance with one embodiment of the present invention, a circuit includes, in part, a charge pump adapted to supply current to a gate terminal of an MOS transistor, a current sense circuit adapted to sense a current flowing through a drain terminal of the MOS transistor and to generate a sense signal in response, and a discharge circuit adapted to discharge current from the gate terminal of the MOS transistor. The discharge current is defined by a difference between the sense signal and a reference signal such that the discharge current increases as the difference increases and the discharge current decreases when the difference decreases. In one embodiment, the discharge current is non-linearly dependent on the difference between the sense signal and the reference signal. In another embodiment, the discharge current is exponentially dependent on the difference between the sense signal and the reference signal.

In accordance with one embodiment of the present invention, a switching circuit includes, in part, first and second transistors disposed between input and output terminals of the switching circuit, a first voltage multiplier that generates a first intermediate signal (that is a multiple of an analog feedback signal) in response to a first phase of a clock signal, a second voltage multiplier that generates a second intermediate signal (that is a multiple of the analog feedback signal) in response to a second non-overlapping phase of the clock signal, and a coupling circuit that selectively applies one of the intermediate signals in response to opposite phases of the clock signal to a pair of terminals of at least one of the first and second transistors so as maintain conductive path between the input and output terminals of the switching circuit when the voltage of the input terminal is higher than the voltage of the output terminal. The coupling circuit turns off the conduction path between the input and output terminals of the switching circuit when the voltage of the input terminal is smaller than the voltage of the output terminal. The first analog signal has a range defined by the first and second supply voltages.

In accordance with one embodiment of the present invention, a circuit includes a pair of voltage multipliers and a coupling circuit. The voltage multipliers are clocked by opposite phases of a clock signal each multiplying an analog input signal—changing between the ground and a supply voltage level—by a predefined multiplication factor to generating two intermediate signals. The coupling circuit selectively couples the intermediate signals on opposite phases of the clock signal between two output terminals, thereby maintaining a continuous-time signal path from the input to the output.

BRIEF DESCRIPTION OF THE DRAWINGS

FIG. 6A is a schematic diagram of a second voltage doubler disposed in the second first charge pump of the RCB switches of FIGS. 1 and 2, in accordance with one embodiment of the present invention.

FIG. 6B shows the timing relationship of the signals received by the second voltage doubler shown in FIG. 6A, in accordance with one embodiment of the present invention.

DETAILED DESCRIPTION OF THE INVENTION

Figure 1:
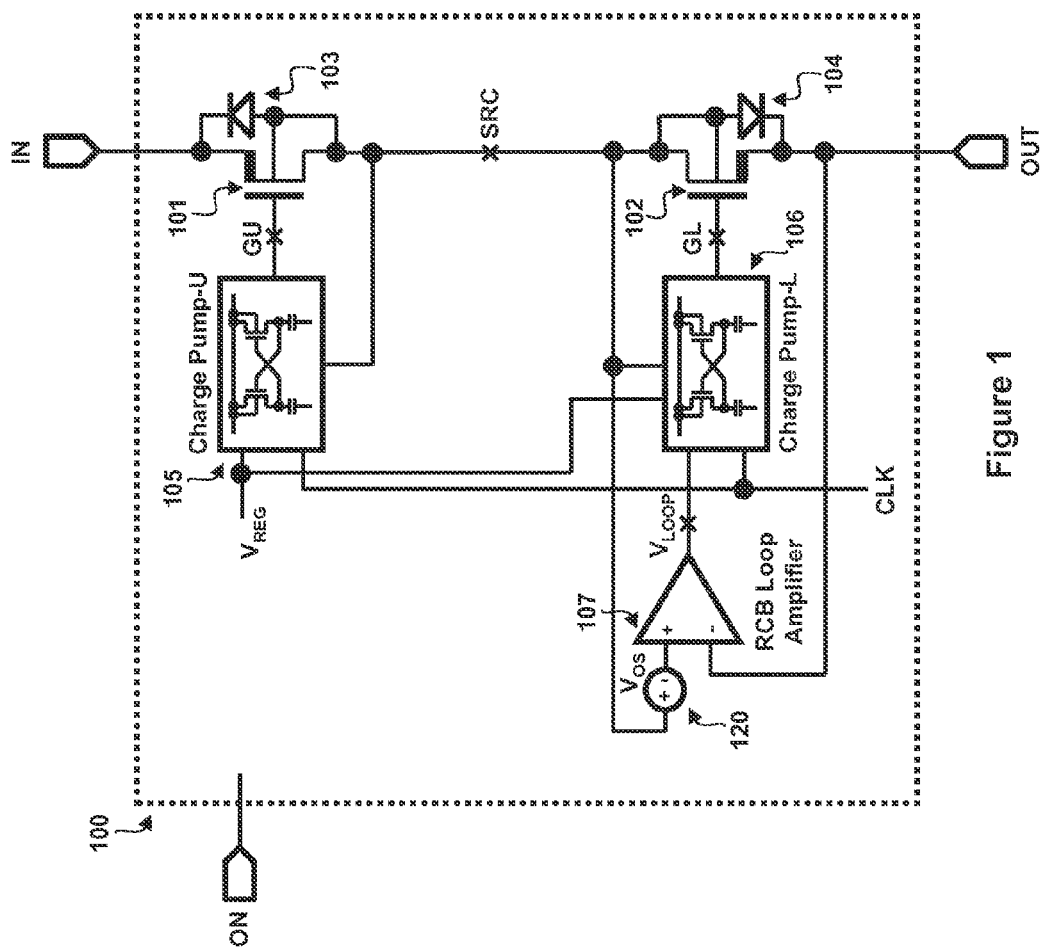
FIG. 1 is a block diagram of an RCB switch, in accordance with one embodiment of the present invention.

FIG. 1 is a schematic block diagram of a Reverse Current Blocking (RCB) Switch 100, in accordance with one embodiment of the present invention. The RCB switch (hereinafter alternatively referred to as switch) 100 is shown as including NMOS transistors 101 and 102, charge pump 105 (driving the gate terminal of NMOS 101), RCB loop amplifier 107, offset voltage source VOS 120, and charge pump 106 driving the gate terminal of NMOS 102. Diodes 103 and 104 represent inherent body diodes of NMOS 101 and 102, respectively. Switch 100 is shown as having an input terminal IN that typically receives an input voltage supply, input terminal ON that controls the operation of switch 100, and an output terminal OUT that is typically coupled to a load. The clock signal CLK applied to charge pumps 105 and 106 may be internally generated or externally supplied.

As is described in detail below, switch 100 is adapted to control the flow of current between input and output terminals IN and OUT depending on the state of a control signal applied to terminal ON. When the control signal applied to terminal ON is in a first state (e.g., high) and the voltage level applied to terminal IN is higher than the voltage of the terminal OUT (i.e., forward direction), switch 100 provides a low resistance path between terminals IN and OUT, thereby enabling current to flow from terminal IN to terminal OUT. When the control signal applied to terminal ON is in the first state and the voltage level at terminal OUT is higher than the voltage level at terminal IN, switch 100 provides an open circuit, thus inhibiting current flow from terminal OUT to terminal IN. When the signal applied to control terminal ON is in a second state (e.g. low), transistors 101 and 102 are turned off (since their gate voltages receive the ground potential, not shown in the figures), thereby causing switch 100 to be turned off and thus inhibiting current flow between input terminal IN and output terminal OUT in both forward and reverse directions. Accordingly, switch 100 may be turned off or operate as a diode-like element with minimal voltage drop in the forward direction.

As described above with respect to the exemplary embodiment shown in FIG. 1, when signal ON is low, the gate terminals of transistors 101 and 102, respectively coupled to nodes GU and GL receive, the ground (GND) potential and are thus tuned off (not shown). Furthermore, since their body diodes are arranged in a back-to-back configuration, the current flow between input terminal IN and output terminal OUT is blocked in both forward and reverse directions.

When Switch 100 is enabled, charge pump 105 receives input voltage VREG, and in response, generates voltages sufficient to turn on transistor 101. The voltages generated by charge pump 105 are applied to the gate (node GU) and source (node SRC) of transistor 101. When turned on, transistor 101 enables current to flow from terminal IN to terminal OUT. However, due to its inherent body diode 103, transistor 103 cannot by itself block the current flow in the reverse direction.

The RCB feedback loop, shown as including offset voltage source (VOS) 120, RCB loop amplifier 107, charge pump 106 and transistor 102, is adapted to stop the current flow from terminal OUT to terminal IN when terminal OUT is at a higher potential than terminal IN. Although offset voltage source 120 is shown as a separate component, it is understood that the offset voltage may be an internal (inherent)) offset voltage of amplifier 107. The RCB loop is adapted to regulate the voltage at terminal OUT to one VOS voltage below the voltage at node SRC. As the load current in the forward direction (from terminal IN to terminal OUT) changes, the RCB feedback loop varies the output voltage VLOOP of amplifier 107. Voltage VLOOP is in turn amplified by the gain of charge pump 106 and subsequently applied to nodes GL and SRC, thereby controlling the channel resistance of transistor 102 such that the voltage drop across its drain-to-source terminals is regulated to be substantially at the VOS potential. As the forward current (i.e. the load current at terminal OUT) is increased, the RCB feedback loop increases the gate drive of transistor 102 in order to maintain this regulation. However the gate voltage of transistor 102 cannot be increased beyond a certain level. When the maximum gate drive capability of the RCB feedback loop is reached, transistor 102 operates with a minimum on resistance, defined by its channel dimensions and its maximum gate drive. Therefore, at this point both transistors 101 and 102 are fully on, thus providing a low resistance path between terminal IN and OUT.

When the voltage of terminal OUT is caused to increase above a target regulation level via an external source, the RCB feedback loop lowers the gate voltage of transistor 102, eventually turning it off. Since transistors 101 and 102 are coupled such that their body diodes 103 and 104 are connected in a back-to-back configuration, the conduction path through these body diodes is also blocked, thereby inhibiting all current conduction in reverse direction between terminals IN and OUT, thus achieving the desired RCB function.

Assume that in some examples charge pumps 105 and 106 have a gain of 2. Accordingly, in such examples, charge pumps 105 and 106 double their input voltage levels (respectively shown as input voltages VREG and VLOOP) to generate output voltages that are differentially applied between their output terminals (i.e., between nodes GU and SRC of transistor 101, and between nodes GL and SRC of transistor 102). In one example, VREG is selected to be 2.5V and transistor 101 is a 5V transistor (its gate-to-source voltage is not to exceed 5 Volts) is fully turned on when it receives 5V between its gate node GU and source node SRC. Similarly, in one example VLOOP is selected to vary between 0V and 2.5V, and transistor 102 is a 5V transistor that is fully turned on when it receives 5V between its gate node GL and source node SRC. In one example, VOS is selected to be 30 mV. It is understood, however, that the above values are exemplary and other VREG values, VLOOP voltage ranges, charge pump gains, VOS values, and transistors with other characteristics and process tolerances may be used in accordance with the embodiments of the present invention.

Figure 2:
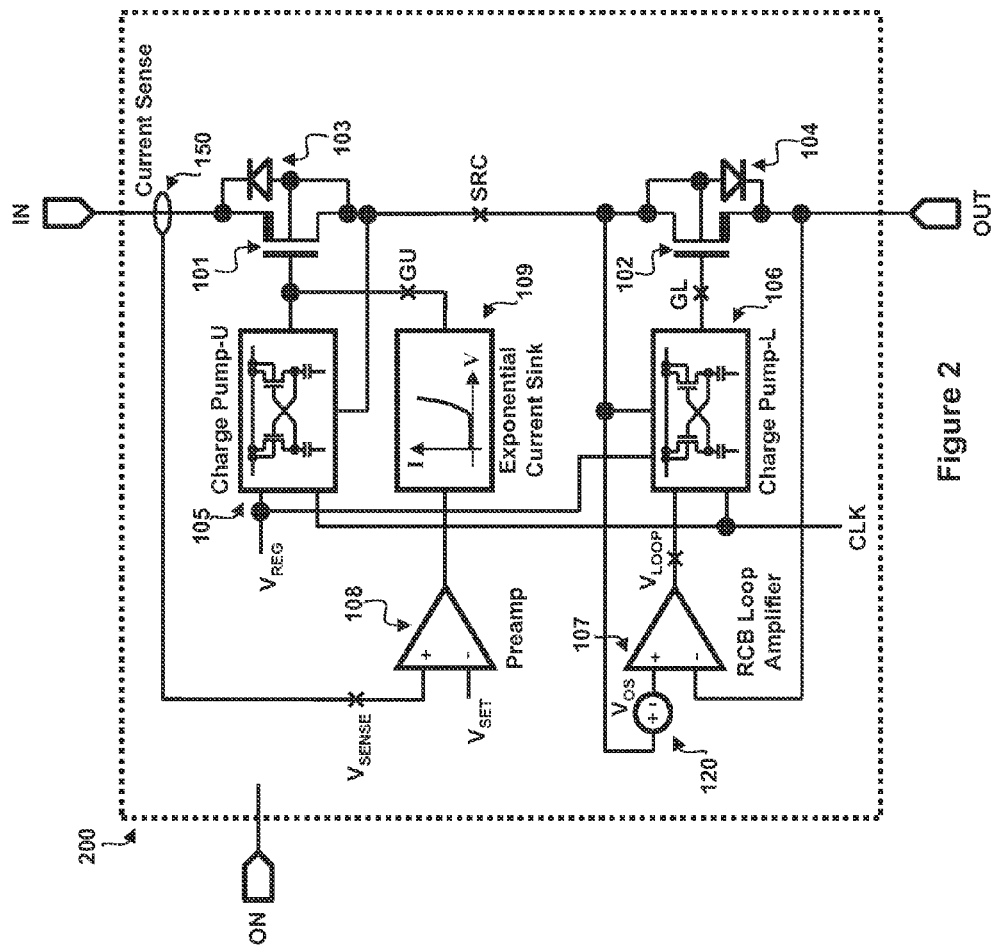
FIG. 2 is a block diagram of an RCB switch, in accordance with another embodiment of the present invention.

FIG. 2 is a schematic block diagram of an RCB switch 200 with current limiting capability, in accordance with another embodiment of the present invention. The RCB Switch 200 (also referred to herein as switch 200) is similar to switch 100 except that switch 200 also includes a current limiting loop, that in turn, is shown as including current sensing circuit 150, preamplifier (preamp) 108 and exponential current sink block 109. Switch 200 is adapted to actively limit the maximum current that may flow from terminal IN to terminal OUT in the forward direction. This maximum current level is defined by the voltage VSET applied to one of the input terminals of preamp 108.

The operation of the current limiting loop of switch 200 is as follows. Charge pump 105 provides a voltage driving the gate of transistor 101. For forward current levels below the level defined by VSET, transistor 101 is fully turned on. The forward current is sensed by current sensing block 150 and is subsequently converted to an equivalent voltage level supplied to the positive input terminal of Preamp 108. Current sensing block 150 may be a conventional current sensing block that, for example, can measure the voltage drop across an internal or external sense resistor. Current sensing techniques are well known to those skilled in the art and are thus not described herein. As the forward current level increases (e.g. due to a changing load demand) the equivalent voltage level at the positive input terminal of preamp 108 approaches voltage VSET. When the voltage at the positive terminal of preamp 108 reaches or exceeds VSET, exponential current sink 109 starts to sink current from node GU. This, in turn, results in regulation of the switching current such that the resulting equivalent voltage level at the positive input terminal of preamp 108 becomes substantially equal to voltage VSET. Exponential current sink 109 is adapted to provide relatively higher sink currents and to substantially reduce the response time of the current limiting function, when the load current becomes significantly higher than the current limit level set by VSET. Such conditions may take place when, for example, a load current surge or a short circuit occurs at output terminal OUT. Accordingly, the size of the current sink increases as the difference between voltages VSENSE and VSET increases. Likewise, the size of the current sink decreases as the difference between voltages VSENSE and VSET increases. For example, the size of the current sink may vary exponentially as a function of voltage VSENSE. In other embodiments, the current sink may vary non-linearly as a function of voltage VSENSE.

Figure 3:
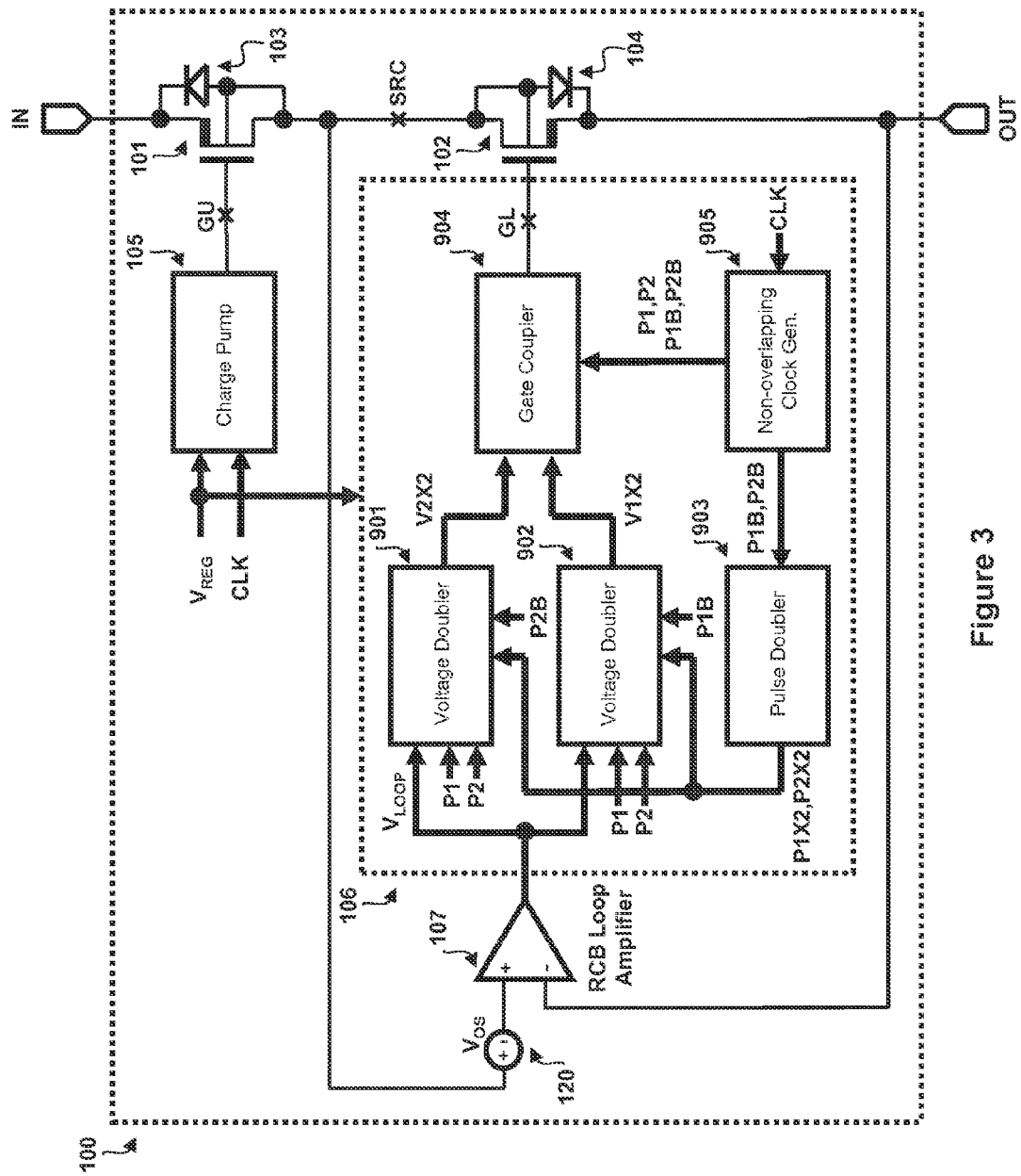
FIG. 3 shows, in part, a number of functional blocks of a first charge pump disposed in the RCB switches of FIGS. 1 and 2, in accordance with one embodiment of the present invention.

FIG. 3 shows a number of blocks of charge pump 106 of switches 100 or 200, in accordance with one exemplary embodiment of the present invention. The RCB loop amplifier 107, used as an error amplifier of the linear RCB loop, receives the voltage of node SRC less the offset voltage VOS at its positive input terminal, the voltage of the terminal OUT at its negative input terminal, and in response supplies output voltage VLOOP to charge pump 106. Charge pump 106 provides an output voltage that is a multiple of voltage VLOOP and applies this voltage between the gate node GL and source node SRC of transistor 102. In the example shown in FIG. 3, the output voltage of charge pump 106 is double the voltage VLOOP. The doubling of the voltage is performed using a pair of voltage doublers 901 and 902 that operate in parallel using opposite phases of a non-overlapping clock generated by non-overlapping clock generator 905.

Voltage doubler 901 generates an output voltage V2X2 that is aligned with the P2 phase of the non-overlapping clock, whereas voltage doubler 902 generates an output voltage V1X2 that is aligned with the opposite non-overlapping phase P1 of the non-overlapping clock. V1X2 and V2X2 are pulsed signals having a high level that is substantially twice the voltage VLOOP, and a low level that is equal to the ground potential. Gate coupler 904 differentially couples voltage signals V1X2 and V2X2 between the gate node (GL) and source node (SRC) of transistor 102.

Figures 5A, 5B:
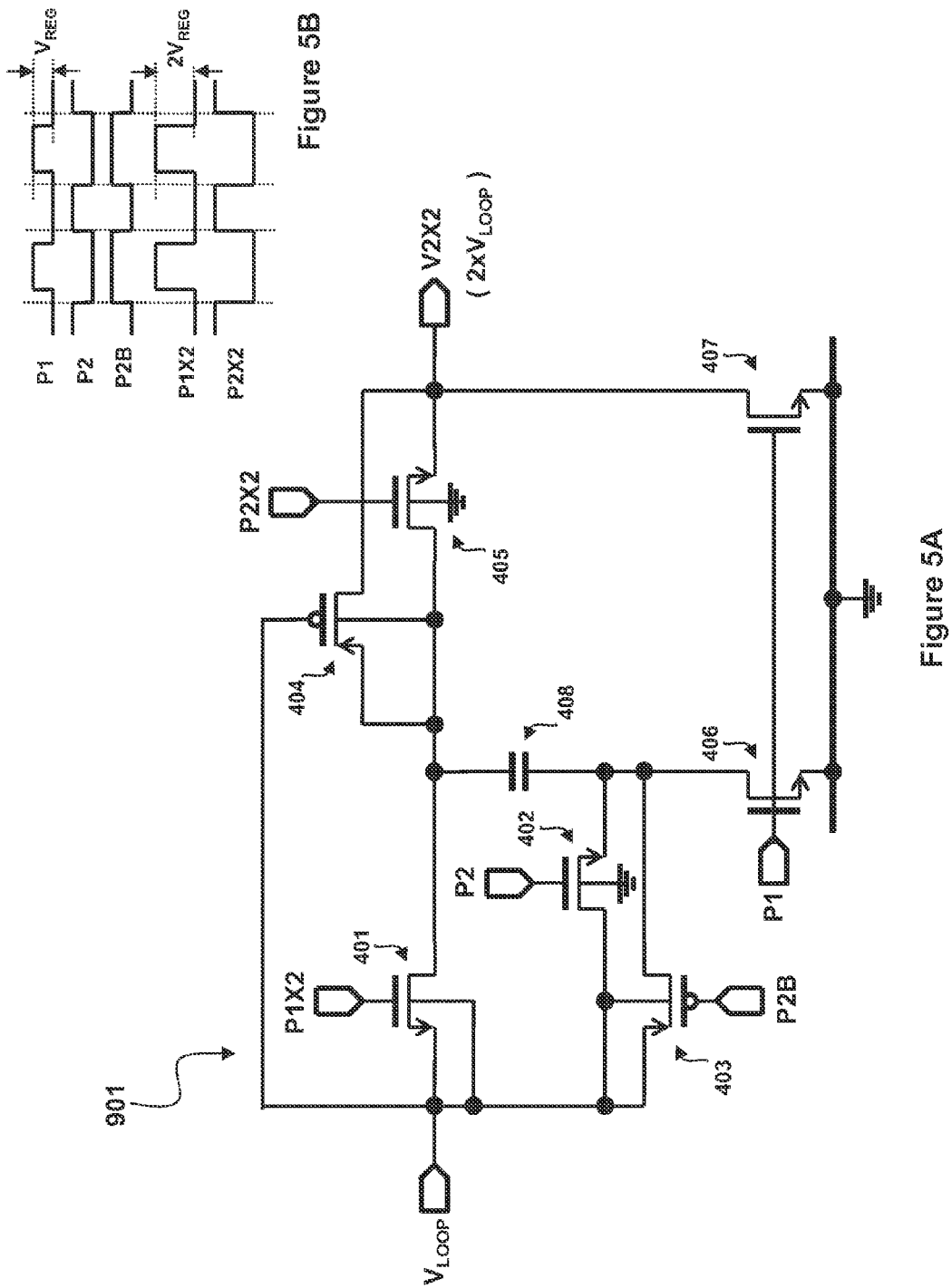
FIG. 5A is a schematic diagram of a first voltage doubler disposed in the first charge pump of the RCB switches of FIGS. 1 and 2, in accordance with one embodiment of the present invention.
FIG. 5B shows the timing relationship of the signals received by the first voltage doubler shown in FIG. 5A, in accordance with one embodiment of the present invention.

Gate coupler 904 may be a capacitive level shifter adapted to shift the ground level of signals V1X2 and V2X2 to the voltage level of node SRC, thus driving the gate node GL to a voltage that is above the SRC voltage by twice the voltage VLOOP. The non-overlapping clock pulses are generated by non-overlapping clock generator 905 in response to a clock signal CLK received at the CLK input of non-overlapping clock generator 905. The output signals of the non-overlapping clock generator 905 are non-overlapping clock pulses P1 and P2 and their inverted replicas P1B and P2B. Clock pulses P1, P2, P1B and P2B vary between voltage levels VREG and ground (i.e., GND.) Pulse doubler 903 is adapted to double the voltage levels of non-overlapping clock signals P1B and P2B that it receives, thereby to generate non-overlapping clock signals P1X2 and P2X2, in turn applied to voltage doublers 901 and 902. The high voltage level of signals P1X2 and P2X2 is twice voltage VREG (i.e., 2×VREG). The low voltage level of signals P1X2 and P2X2 is the ground potential. The timing relationship between the non-overlapping clock phases P1, P2, P1B, P2B, P1X2 and P2X2, are shown in FIGS. 5B and 6B.

By doubling the loop voltage VLOOP in an alternating manner—using dual voltage doublers 901 and 902—and coupling them between the gate and source nodes of transistor 102 via differential gate coupler 904, a nearly continuous closed RCB loop that is not disturbed by the clock phases is achieved, in accordance with embodiments of the present invention. The RCB loop is only broken during very short (e.g., few nanoseconds) non-overlapping clock dead zones of signals P1 and P2. Such clock dead zones can be used to improve charge transfer performance of the switched capacitor circuits (voltage doublers 901, 902, pulse doubler 903, and gate coupler 904) and since their duration is very short, they do not adversely affect loop performance.

In one example, voltage VREG is selected to be 2.5V, thus enabling switch 100 and 200 to operate with supply voltages as low as 2.5V. In such examples, transistors 101 and 102 become fully conductive when their gate-to-source voltages is about 5 Volts. In such examples, voltage signal VLOOP, which is generated by circuitry operating at 2.5 volts, is doubled by the voltage doublers 901 and 902 before being coupled to the gate of transistor 102 to ensure that sufficient gate drive levels are achieved at the gate node GL. In other embodiments, different VREG voltage levels, different charge pump gains, and transistors with different characteristics can be used to achieve similar functionality.

Figure 4:
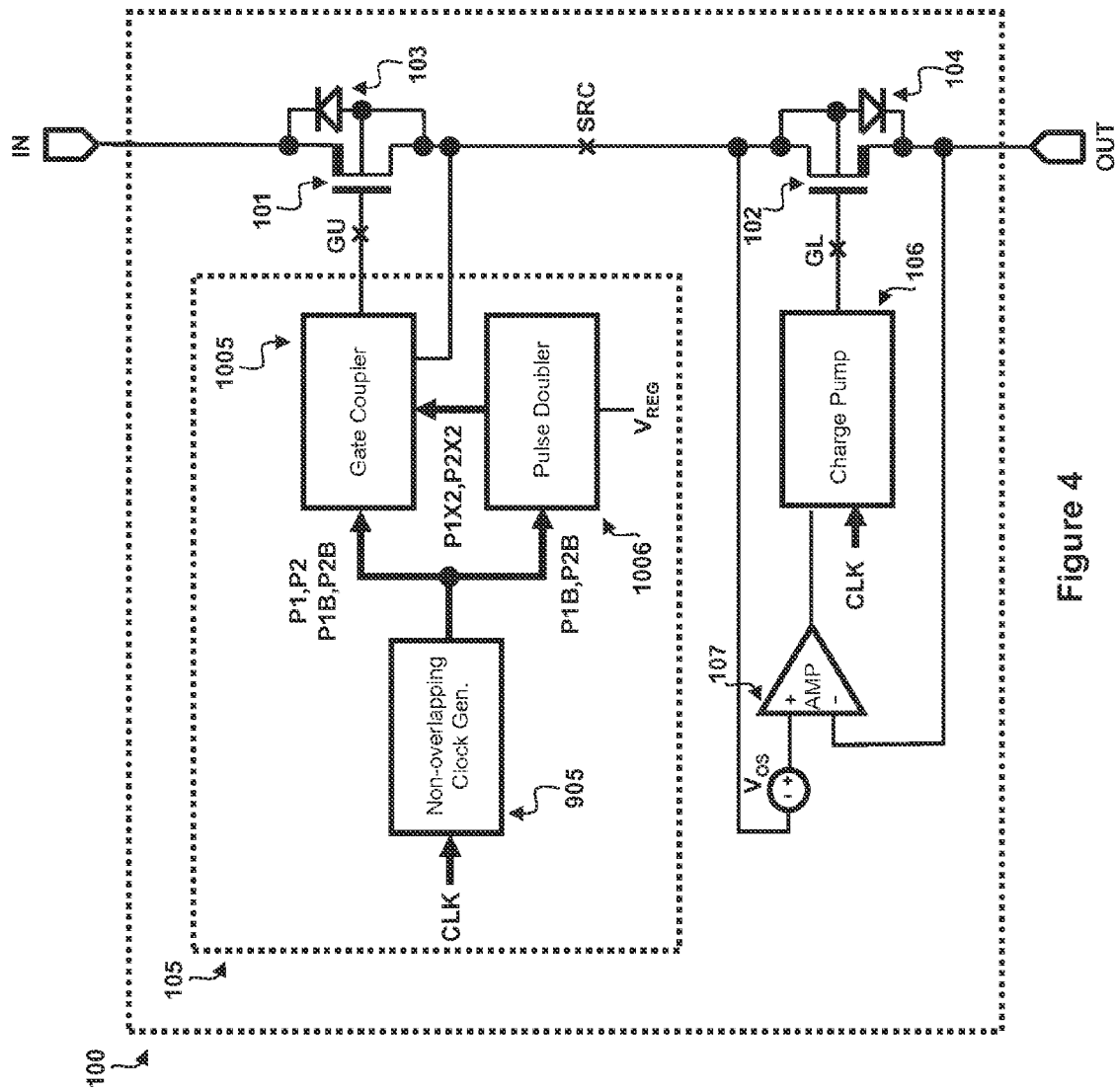
FIG. 4 shows, in part, a number of functional blocks of a second charge pump disposed in the RCB switches of FIGS. 1 and 2, in accordance with one embodiment of the present invention.

FIG. 4 shows a number of blocks of charge pump 105 of switches 100 or 200, in accordance with one exemplary embodiment of the present invention. Referring to FIGS. 1 and 2, charge pumps 105 and 106 operate independently from one another. Non-overlapping clock generator 905 is adapted to generate non-overlapping clock signals from a clock signal it receives at its clock input terminal CLK. The output signals of the non-overlapping clock generator 905 are non-overlapping clock phases P1 and P2 and their inverted replicas P1B and P2B. Non-overlapping clock pulses P1, P2, P1B and P2B vary between voltage levels VREG and GND (for logic high and low, respectively). Pulse doubler 1006 is adapted to double the voltage levels of non-overlapping clock signals P1B and P2B, to generate clock signals P1X2 and P2X2. The high voltage level of signals P1X2 and P2X2 is twice voltage VREG. The low voltage level of signals P1X2 and P2X2 is the ground potential.

Figure 7B:
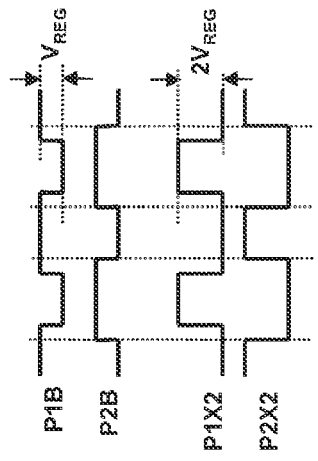
FIG. 7B shows the timing relationship of the signals applied to and generated by the pulse doubler of FIG. 7A, in accordance with one embodiment of the present invention.
Figure 9B:
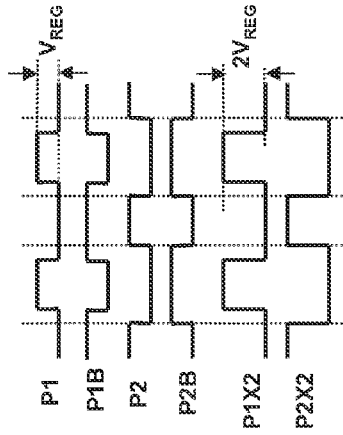
FIG. 9B shows the timing relationship of the signals received by the gate coupler of FIG. 9A, in accordance with one embodiment of the present invention.
Figure 9A:
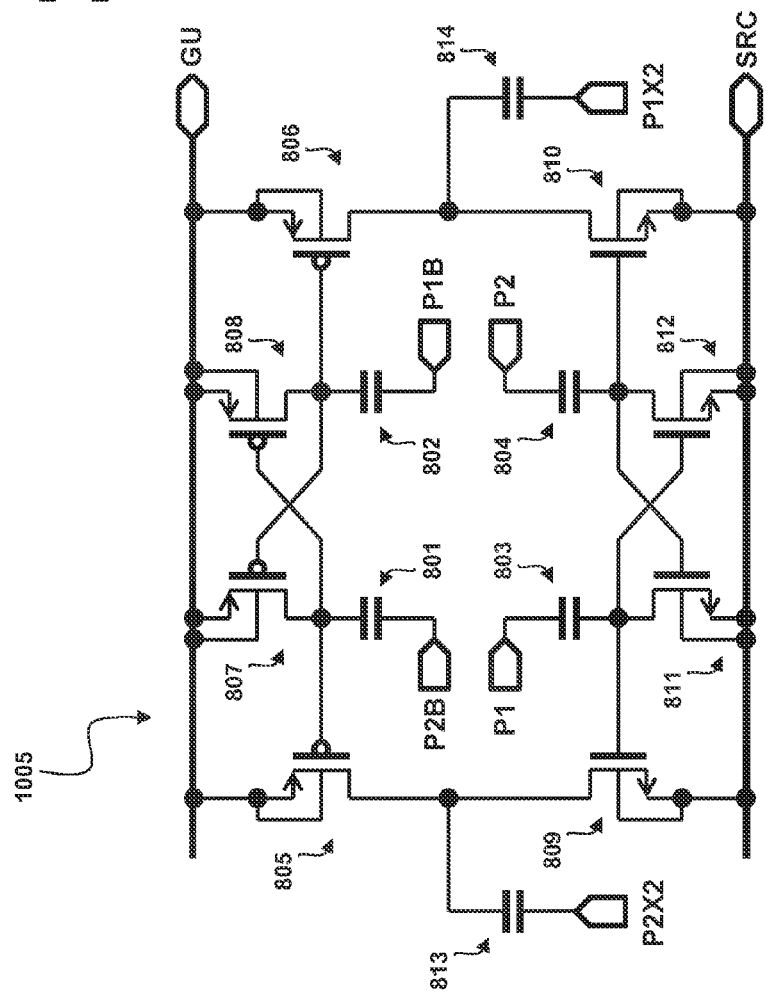
FIG. 9A is a schematic diagram of a gate coupler disposed in the second charge pump of the RCB switches of FIGS. 1 and 2, in accordance with one embodiment of the present invention.

Gate coupler 1005 receives and applies signals P1X2 and P2X2 to the gate terminal of transistor 101 in accordance with the non-overlapping clock pulses P1, P2, P1B, and P2B. Gate Coupler 1005 differentially couples signals P1X2 and P2X2 between the gate and source nodes of transistor 101. Gate coupler 1005 may be a capacitive level shifter adapted to shift the ground level of signals P1X2 and P2X2 to the voltage level of node SRC, thus driving node GU to a voltage that is above the SRC voltage by twice the voltage VREG. Pulse doubler 1006 is identical to pulse doubler 903 shown in FIG. 7A, and the timing relationship between the non-overlapping clock phases P1B, P2B, P1X2 and P2X2 used by pulse doubler 1006 is shown in FIG. 7B and described further below. A schematic diagram of gate coupler 1005 is shown in FIG. 9A, and the timing relationship between the non-overlapping clock phases P1, P2, P1B, P2B, P1X2 and P2X2 used by gate coupler 1005 is shown in FIGS. 9B, and described further below.

As described above, in the exemplary embodiments shown in FIGS. 1, 2 and 3, charge pump 106 of is adapted to increase the output voltage of amplifier 107 by a factor of 2. The output voltage of amplifier 107, namely VLOOP, is a linear signal having a range from GND to VREG. In accordance with embodiments of the present invention, near lossless doubling of amplifier 107's output voltage is achieved. This voltage doubling has a relatively large dynamic range and extends down to the ground potential.

FIG. 5A is a schematic diagram of voltage doubler 901 of FIG. 3, in accordance with one exemplary embodiment of the present invention. FIG. 5B shows the timing relationship between signals P1, P2, P2B, P1X2, and P2X2 received by voltage doubler 901. Voltage doubler 901 generates its output signal V2X2 in alignment with signal P2 and operates as described below. When signal P1 is high (i.e. charging phase), capacitor 408 is charged to the loop voltage VLOOP through NMOS transistors 401 and 406. Since VLOOP can vary between the GND level and VREG, in order to fully charge capacitor 408, NMOS transistor 401 is turned on with a voltage higher than VREG. Transistor 401 can be turned off without causing any backward current leak during the next phase (P2) and during which capacitor 408's bottom plate is pulled up from the GND to VLOOP potential. When P2 is high (i.e. doubling phase), since NMOS transistors 401, 406 are off and NMOS transistor 402 and PMOS transistor 403 are on, the top plate of the previously charged capacitor 408 rises up to 2×VLOOP potential; this potential can reach as high as 2×VREG. During the doubling phase of P2, NMOS transistor 405 is on, and for loop voltages larger than the PMOS transistor threshold, PMOS transistor 404 is also on to compensate for the decrease in NMOS transistor 405's conductance when voltage VLOOP approaches voltage VREG. The gate terminals of NMOS transistors 401 and 405 are driven by non-overlapping clock pulses that have a logic level of 2×VREG and a low logic level of GND. Signals P1X1 and P2X2 are generated by pulse doubler 903 (see FIG. 3) whose transistor schematic diagram is shown in FIG. 7A and described further below.

FIG. 6A is a schematic diagram of voltage doubler 902 of FIG. 3, in accordance with one exemplary embodiment of the present invention. FIG. 6B shows the timing relationship between signals P1, P2, P1B, P2X2, and P1X2 received by voltage doubler 902. Voltage doubler 902 is similar to and operates in the same manner as voltage doubler 901 except that transistors 502, 506, 507, 503, 501 and 505 of voltage doubler 902 receive non-overlapping clock signals P1, P2, P2, P1B, P2X2 and P1X2 signals, whereas similarly arranged transistors 402, 406, 407, 403, 401 and 405 of voltage doubler 901 receive non-overlapping clock signals P2, P1, P1, P2B, P1X2 and P2X2, respectively. The use of dual voltage doublers in an RCB switch, in accordance with embodiments of the present invention, advantageously enables one of the voltage doublers to precharge its associated capacitor while the other voltage doubler couples its associated precharged capacitor to the output by shifting its bottom plate from GND to VLOOP potential thereby causing the loop voltage VLOOP to nearly double.

Figure 7A:
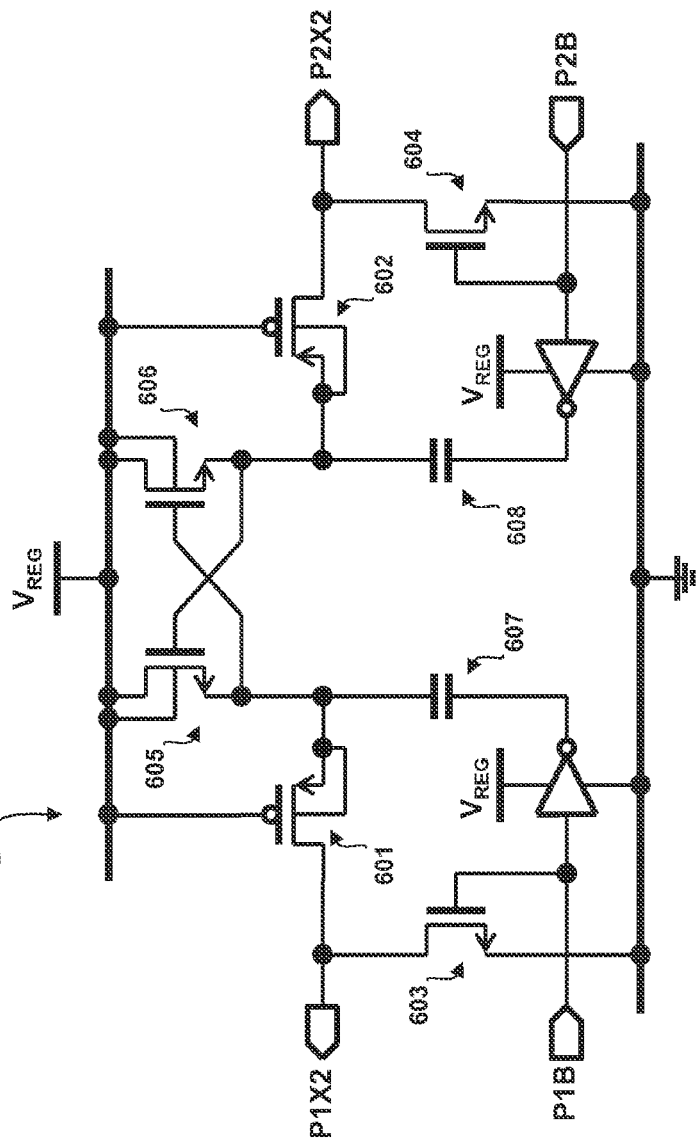
FIG. 7A is a schematic diagram of a pulse doubler disposed in the first charge pump of the RCB switches of FIGS. 1 and 2, in accordance with one embodiment of the present invention.

FIG. 7A is a schematic diagram of pulse doubler 903 of switch 100 of FIG. 3, in accordance with one exemplary embodiment of the present invention. Pulse doubler 903 is adapted to receive signals P1B, P2B, and generate signals P1X2 and P2X2 in response. FIG. 7B is a timing diagram of signals P1B, P2B, P1X2 and P2X2. Cross-coupled NMOS transistors 605, 606, together with capacitors 607 and 608 are used to generate a voltage that varies between VREG and 2×VREG at the top plates of capacitors 607 and 608. PMOS transistors 601 and 602 turn on when the top plates of capacitors 607 and 608 exceed VREG by more than one PMOS transistor threshold.

During phase P1 (i.e., when signal P1B is low, as shown in FIG. 6B) PMOS transistor 601 turns on thus causing output signal P1X2 to reach the voltage level of 2×VREG. During the opposite phase P2 (i.e., when signal P2B is low, as shown in FIG. 6B) PMOS transistor 602 turns on thus causing output signal P2X2 to reach the voltage level of 2×VREG. As the voltage level at the top plates of capacitors 607 and 608 go down to voltage VREG in alternate phases of the clock signal, PMOS transistors 601 and 602 turn off, and NMOS transistors 603 and 604 pull down output signals P1X2 and P2X2 to the ground potential. Accordingly, a voltage swing of 0V to 2×VREG is achieved at output signals P1X2 and P2X2, which are in phase with signals P1 and P2 respectively (see FIGS. 6A and 6B). Referring to FIGS. 3, 5A and 6A, pulse doubler 903 applies its output voltage signals P1X2 and P2X2 to voltage doublers 901 and 902. Pulse doubler 1006 of switch 100 of FIG. 4 is similar in structure and operation to pulse doubler 903. As is seen from FIG. 4, the output signals P1X2 and P2X2 of pulse doubler 1006 are applied to gate coupler 1005.

Figure 8B:
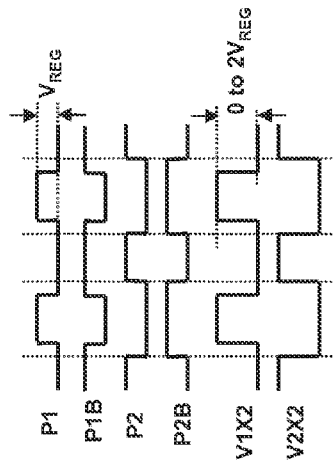
FIG. 8B shows the timing relationship of the signals received by the gate coupler of FIG. 8A, in accordance with one embodiment of the present invention.
Figure 8A:
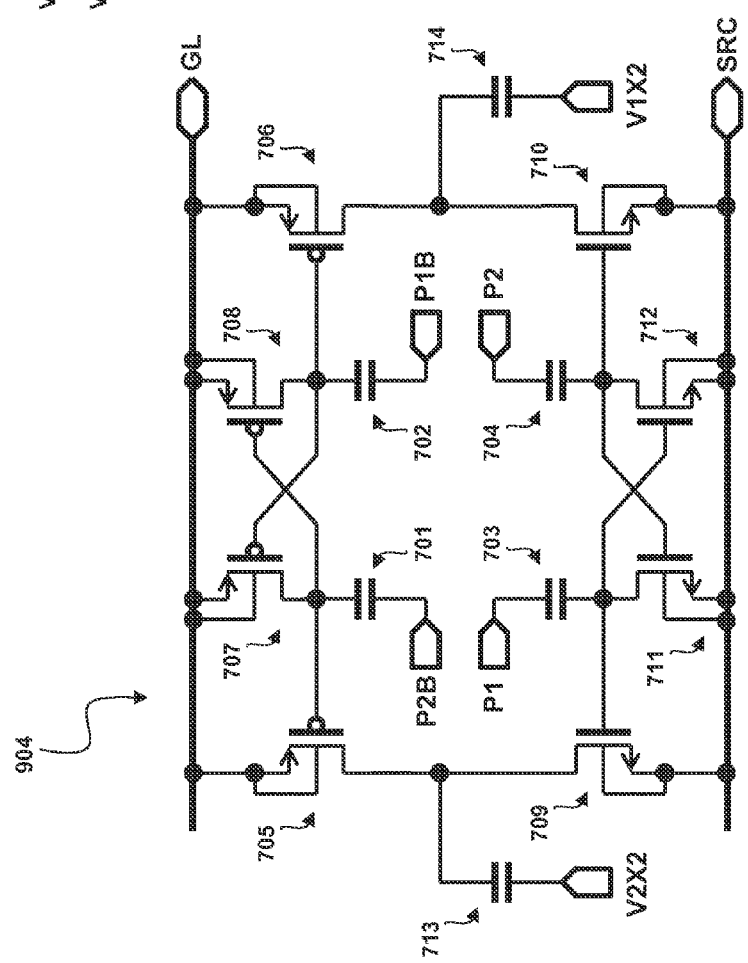
FIG. 8A is a schematic diagram of a gate coupler disposed in the first charge pump of the RCB switches of FIGS. 1 and 2, in accordance with one embodiment of the present invention.

FIG. 8A is a schematic diagram of gate coupler 904 disposed in charge pump 106 of FIG. 3, in accordance with one exemplary embodiment of the present invention. FIG. 8B shows the timing relationships between input and output signals of gate coupler 904. The non-overlapping clock signals P1 and P2 are coupled to the gate terminals of cross-coupled NMOS transistors 711 and 712 through capacitors 703 and 704. The source terminals of NMOS transistors 711 and 712 are connected to the common source node SRC, as is seen in FIG. 3. Cross-coupled transistors 711 and 712 are used to periodically refresh the charge on capacitors 703 and 704 in an alternating manner. Ideally the only charge loss from capacitors 703 and 704 is through the junction leakage of NMOS transistors 711 and 712. The charge losses due to parasitic charge partitioning are recovered at the opposite phase. Since P1 and P2 are non-overlapping clock signals, transistors 711 is turned off before transistor 712 is turned on, and transistors 712 is turned off before transistor 711 is turned on. The use of the non-overlapping clock signals P1 and P2 minimizes any charge losses that can occur through transistors 711 and 712 due to timing misalignments.

When signal P1 is high and signal P2 is low, transistor 712 is on, transistor 711 is off, and capacitor 704 is charged with the voltage of the common source node SRC. Since NMOS transistor 709 has the same gate-to-source voltage as transistor 712, transistor 709 is also turned on when P1 is high and P2 is low. Likewise, since transistor 710 has the same gate-to-source voltage as transistor 711, transistor 710 is also turned on when P2 is high and P1 is low.

The upper portion of gate coupler 904 includes cross-coupled PMOS transistors 707, 708, capacitors 701 and 702, and PMOS transistors 705 and 706. The source terminals of transistors 705-708 are connected to node GL (see also FIG. 3). Since P1B is the inverse of P1, and P2B is the inverse of P2, during phase P1 (i.e., when P1 is high and P1B is low), transistors 706, 707 are on, and transistors 705, 708 are off. During the opposite phase P2 (i.e., when P1 is low and P1B is high), transistors 705, 708 are on, and transistors 706, 707 are off. Cross-coupled transistors 707 and 708 are used to periodically refresh the charge on capacitors 701 and 702 in an alternating manner. Since P1B and P2B are non-overlapping clock signals, transistors 707 is turned off before transistor 708 is turned on, and transistors 708 is turned off before transistor 707 is turned on. The use of the non-overlapping clock signals P1B and P2B minimizes any charging that can occur through transistors 707 and 708 due to timing misalignments.

When signal P1B is high and signal P2B is low, transistor 708 is on, transistor 707 is off, and capacitor 702 is charged with the voltage of node GL. Since transistor 705 has the same gate-to-source voltage as transistor 708, transistor 705 is also turned on when P1B is high. Likewise, since transistor 706 has the same gate-to-source voltage as transistor 707, transistor 706 is also turned on when P2B is high and P1B is low.

As mentioned above, during phase P1, output voltage V2X2 is at 0 Volts and output voltage V1X2 is at 2×VLOOP Volts. During this phase, NMOS transistor 709 is on and PMOS transistor 705 is off, therefore, capacitor 713 is charged with the voltage of the common source node SRC. Concurrently, since NMOS transistor 710 is off and PMOS transistor 706 is on, the precharged capacitor 714 will supply a charge proportional to 2×VLOOP to node GL.

Since the voltage doubler 902 shown in FIG. 6A also has a capacitive output, the charge coupling in most part takes place through the equivalent series capacitances of capacitor 508 of FIG. 6A and capacitor 714 of FIG. 8. As the phases change between P1 and P2, the precharge and coupling operations keep on alternating between the symmetrical transistors of gate coupler 904. As a result, in a steady-state, and neglecting losses due to charge partitioning into the parasitic capacitors, node GL is charged to a voltage that is higher than the voltage of node SRC by the amount 2×VLOOP. Consequently, referring to FIG. 1 or 2, the corresponding gate-to-source voltage of transistor 102 is nearly 2×VLOOP. The use of capacitive coupling in the transfer of the input and control signals from the low voltage GND referenced section of the circuitry to SRC referenced section (i.e. Gate Coupler) which typically runs at higher voltages, makes operation at high IN/OUT voltages possible by using high voltage compatible capacitors for capacitors 701-704, 713 and 714.

FIG. 9A is a schematic diagram of gate coupler 1005 disposed in charge pump 105 shown in FIG. 4. Gate coupler 1005 is similar to gate coupler 904 described above except that that the input voltages P1X2 and P2X2 of gate coupler 1005 are pulses switching between 0V and 2×VREG Volts. As a result, the gate terminal GU of NMOS transistor 101 in FIG. 4 is charged up to a level that is higher than the voltage of node SRC by 2×VREG Volts. FIG. 9B shows the timing relationships between input and output signals of gate coupler 1005.

Figure 10:
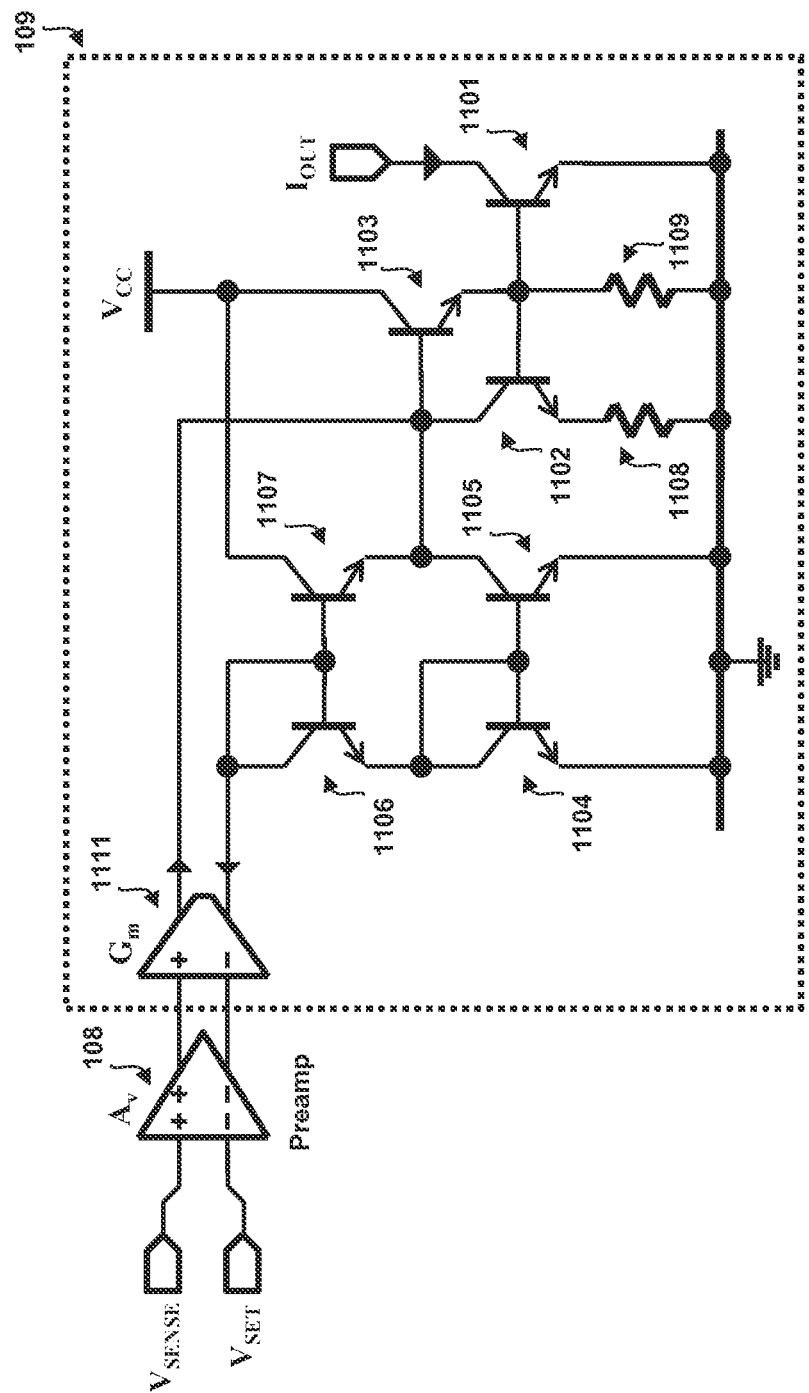
FIG. 10 is a schematic diagram of the exponential current sink disposed in the RCB switch of FIG. 2, in accordance with one embodiment of the present invention.

FIG. 10 is a schematic diagram of exponential current sink 109, in accordance with one embodiment of the present invention, in communication with preamplifier 108, as shown in FIG. 2. Preamp 108 is adapted to preamplify the current sense error signal (the voltage equivalent of the current sensed by current sense circuit 150 of Figure—in other words after the sensed current is converted to a voltage signal Vsense). It is understood that preamp 108 may not be necessary if the sensed current signal is sufficiently large to drive Gm (transconductance) stage 1111. Gm stage 1111 delivers a differential input current for exponential current sinking using transistors 1101-1107 that are shown as being bipolar transistors, and resistive elements 1108-1009. The Gm stage 1111 may be formed using simple p-type differential pair amplifier or alternatively using a folded-cascode amplifier.

The DC bias currents required to bias current mirrors 1104-1106 are not shown in FIG. 10 for simplicity but it is understood that Gm stage 1111 includes a DC bias circuit. After being mirrored and converted into a single-ended signal, the differential current generated by the Gm stage 1111 is applied to the exponential current generator circuit that includes transistors 1101-1103, and resistive elements 1108 and 1109. The voltage drop across resistive element 1108 is linearly proportional to the sensed current. Due to the exponential IC/VBE characteristic of a bipolar transistor, collector current of transistor 1101 is an exponential function of the sensed current. Transistor 1103 is adapted to deliver the relatively large current required by the base of transistor 1101 and to maintain the exponential transfer characteristic even at large output currents. Transistor 1107 clamps the base of transistor 1103 at one VBE (base-to-emitter voltage) voltage above the ground voltage. By clamping the base of transistor 1103 at one VBE above the ground voltage, transistor 1107 maintains transistor 1105 out of saturation and further provides fast turn-on time for the exponential output mirror.

The exponential current sink 109 is further adapted to relatively quickly discharge the gate terminal GU of transistor 101 (see FIG. 2) in the event of an overload condition at the output of switch 200. Referring to FIG. 5, charge pump 105 is the only source adapted to deliver, for example, a few hundred nano-amps of current to node GU. Since the current sunk from node GU by exponential current sink block 109 may be substantially higher than the current sourced by charge-pump 105 to node GU, the voltage at node GU is relatively quickly lowered to a programmed current limit value.

Due to the exponential nature of the current sink circuit, a small amount of overdrive on top of the programmed current limit value provides a relatively large amount of current sink from node GU. The exponential current sink gradually decreases and eventually stops as the load current equals the programmed current limit value. The exponential current sink circuit provides higher sink currents when the load current is significantly higher than the current limit level set by VSET, as may be the case when a load current surge or a short circuit occurs at terminal OUT, thereby substantially reducing the response time of the current limiting function to such adverse conditions. Under steady state current limit conditions, the sink current is substantially equal to the current delivered to the node GU by the charge pump, resulting in current limit operation with minimum current ripple.

The above embodiments of the present invention are illustrative and not limiting. Various alternatives and equivalents are possible. The invention is not limited by the type of voltage multiplier, pulse multiplier, charge pump, etc. The invention is not limited by the type of integrated circuit in which the present invention may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A circuit comprising:
    a charge pump adapted to supply current to a gate terminal of an MOS transistor;
    a current sense circuit adapted to sense a current flowing through the MOS transistor and to generate a sense signal in response; and
    an analog discharge circuit adapted to discharge the gate terminal of the MOS transistor using a discharge current defined by an analog difference between the sense signal and a reference signal, said discharge current including:
        a first current value associated with a first difference value;
        a second current value larger than the first current value, the second current value being associated with a second difference value larger than the first difference value;
        a third current value larger than the second current value, the third current value being associated with a third difference value larger than the second difference value;
        a fourth current value larger than the third current value, the fourth current value being associated with a fourth difference value larger than the third difference value;
        a fifth current value larger than the fourth current value, the fifth current value being associated with a fifth difference value larger than the fourth difference value; and
        a sixth current value larger than the fifth current value, the sixth current value being associated with a sixth difference value larger than the fifth difference value.

2. The circuit of claim 1, wherein said discharge current is a continuous strictly increasing function of the difference between the sense signal and the reference signal.

3. The circuit of claim 1, wherein said discharge current is non-linearly dependent on the difference between the sense signal and the reference signal.

4. The circuit of claim 1, wherein said discharge current is linearly dependent on the difference between the sense signal and the reference signal.

* * * * *